(12) United States Patent
Morrison et al.

(10) Patent No.: US 7,501,313 B2
(45) Date of Patent: Mar. 10, 2009

(54) METHOD OF MAKING SEMICONDUCTOR BGA PACKAGE HAVING A SEGMENTED VOLTAGE PLANE

(75) Inventors: Michael W. Morrison, Boise, ID (US);
Walter L. Moden, Meridian, ID (US);
Corey Jacobsen, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 144 days.

(21) Appl. No.: 11/483,452

(22) Filed: Jul. 10, 2006

(65) Prior Publication Data

US 2006/0270107 A1 Nov. 30, 2006

Related U.S. Application Data

(62) Division of application No. 10/797,647, filed on Mar. 10, 2004, now Pat. No. 7,233,064.

(51) Int. Cl.
*H01L 21/00* (2006.01)
(52) U.S. Cl. .................. 438/118; 438/122; 438/123; 438/124; 257/698; 257/738; 257/780
(58) Field of Classification Search .............. 257/698, 257/738, 780; 438/118, 122, 123, 124
See application file for complete search history.

(56) References Cited

U.S. PATENT DOCUMENTS 5,895,967 A 4/1999 Stearns et al.
6,268,650 B1 7/2001 Kisnman et al.
6,300,165 B2 10/2001 Castro
6,534,861 B1 3/2003 Castro
2002/0008307 A1 1/2002 Dickey
2002/0121688 A1 9/2002 Kinsman et al.

OTHER PUBLICATIONS

Merriam-Webster Online Dictionary, www.m-w.com (2 pages).

*Primary Examiner*—Zandra Smith
*Assistant Examiner*—Telly D Green
(74) *Attorney, Agent, or Firm*—TraskBritt (57) ABSTRACT

A semiconductor device assembly and method of making the device are disclosed. The assembly comprises a semiconductor die attached to an electrically conductive layer, which is, in turn, connected to a dielectric layer carrying conductive traces of the electrical connection layer. The conductive traces provide connection between an array of discrete conductive elements and bonding wires connected to bond pads of the die. The conductive layer enhances thermal conduction and structural stiffness for the assembly. In addition, the conductive layer provides a voltage reference plane that may be connected to a power source, a ground source, or an intermediate reference voltage. The conductive layer also includes at least one electrical current isolation slot, which segments the conductive layer to help isolate noise induced in one segment of the conductive layer from the other segments.

20 Claims, 4 Drawing Sheets

METHOD OF MAKING SEMICONDUCTOR BGA PACKAGE HAVING A SEGMENTED VOLTAGE PLANE

CROSS-REFERENCE TO RELATED APPLICATION

This application is a divisional of application Ser. No. 10/797,647, filed Mar. 10, 2004, now U.S. Pat. No. 7,233,064, issued Jun. 19, 2007.

BACKGROUND OF THE INVENTION

Field of the Invention

The present invention relates generally to structures for providing interconnections for semiconductor devices. More particularly, it relates to ball grid array packages and conductive structures for interconnecting semiconductor devices to the BGA packages.

Semiconductor devices are packaged in many ways. The packaging performs a number of functions, one of the most important being the creation of a connection mechanism between bond pads on a semiconductor die and some type of substrate to which the packaged semiconductor die is mounted.

Packaging memory devices can have a unique set of problems. In memory architectures, it is often advantageous to place the die bond pads down the center of a die, creating a lead over chip (LOC) or board on chip (BOC) configuration. LOC package structures typically employ an etched or stamped lead frame with a slot down the center. The active surface of the die is attached to a bottom surface of the lead frame. Bonding is accomplished by placing bond wires on the bond pads running down the center of the die. The bond wires then extend through the slot in the lead frame and attach to a top surface on the lead frame. An encapsulant is then applied over the die and over a portion of the lead frame to protect the bonding wires. These packages typically come in the form of plastic leaded chip carriers, small outline packages, and thin shrink small outline packages. BOC package structures are similar but typically comprise some type of interposer substrate carrying conductive traces. The active surface of the die is attached to a bottom surface of a structural interposer layer with signal routing on the interposer. As with LOC packages, an encapsulant typically protects the bonding pads and bond wires. BOC packages are also available in a variety of package configurations.

Ball Grid Array (BGA) packages have become increasingly popular due to the high signal densities available from arranging the package interface signals in an array and work particularly well with BOC package configurations. In one type of BGA product, the interposer is comprised of a resin material, which is adhered to the active surface of a semiconductor die. Solder balls are formed on the resin material. Conductive traces on the resin material connect to the solder balls and to bonding wires connected to bond pads of the semiconductor die. It would be advantageous to incorporate a reinforcing layer in this type of packaging configuration to add stiffness and provide a more substantial substrate without substantially increasing overall size of the package.

As BGA packages migrate toward higher connection densities, such as Fine Pitch Ball Grid Arrays (FBGA) and Extra Fine Pitch Ball Grid Arrays (EFBGA), some additional problems become more severe. The trend toward higher speeds in smaller packages creates both thermal and electrical problems. As semiconductor package size decreases, operating frequencies increase, circuit densities increase, and significant heat is generated, which must be dissipated away from the die as effectively as possible. Heat dissipation is a particular problem with a smaller package where there is less surface area for heat dissipation. These problems of providing structural stiffness and heat dissipation have been addressed in the past. Kinsman et al. in U.S. Pat. No. 6,268,650 and Castro et al. in U.S. Pat. No. 6,300,165 each address semiconductor device assemblies providing enhanced thermal performance with added structural stiffness.

However, higher operating frequencies and higher signal frequencies employed in current semiconductor devices also create coupling noise between signals as well as voltage bounce and noise on power and ground voltage references. Therefore, there is a need for a BGA package that provides enhanced structural stiffness and high thermal conductivity but is also capable of reducing high frequency signal noise, and creating more stable power and ground voltage references.

BRIEF SUMMARY OF THE INVENTION

One exemplary embodiment of the invention comprises a semiconductor device assembly comprising a semiconductor die attached to an electrically conductive layer with a dielectric adhesive, which may be thermally conductive. The semiconductor die has bond pads in a row, or a plurality of parallel rows, extending substantially along the center of the die. The electrically conductive layer contains a longitudinal slot configured such that when the semiconductor die is attached to the electrically conductive layer, the bond pads are exposed through the slot. The electrically conductive layer provides thermal conduction to draw heat away from the semiconductor die and structural stiffness to the final semiconductor device assembly. In addition, the electrically conductive layer provides a voltage reference plane that may be connected to a power source, a ground source, or an intermediate reference voltage source. The electrically conductive layer also includes at least one additional slot referred to as an electrical current isolation slot. The electrical current isolation slot, or slots, segments the electrically conductive layer to help isolate noise induced in one segment of the electrically conductive layer from the other segments.

A dielectric film is attached to the electrically conductive layer. A top surface of the dielectric film contains an electrical connection layer comprising a pattern of conductive traces extending between bonding landing areas near the longitudinal slot and ball placement locations distributed across the dielectric film. Additionally, the dielectric film includes one or more conductive vias formed therethrough connecting one or more conductive traces on the top surface of the dielectric film to the electrically conductive layer adhered to the bottom surface of the dielectric film. The conductive vias form an electrical connection for moving current between the electrically conductive layer and discrete conductive elements such as solder balls disposed on the dielectric film. The conductive vias also assist in conducting heat away from the electrically conductive layer.

Bonding wires connect the electrically conductive layer to one or more bond pads on the semiconductor die, which are connected to the desired voltage reference. Additional bonding wires connect other bond pads on the semiconductor die to conductive traces of the electrical connection layer. Discrete conductive elements such as solder balls disposed on the dielectric film provide structural and electrical connection for the semiconductor device through their associated conductive traces to an external system substrate such as a circuit board.

A dielectric encapsulant protects the bonding wires and the portion of the die exposed through the longitudinal slot.

Another exemplary embodiment of the invention comprises a package substrate or interposer substrate for receiving a semiconductor die thereon. The package substrate comprises the dielectric film with the conductive traces adhered to the electrically conductive layer containing the longitudinal slot and one or more current isolation slots as described above.

This embodiment is configured to receive the semiconductor die, which may be attached to the electrically conductive layer with a thermally conductive dielectric adhesive. Additionally, this embodiment is configured to receive solder balls in a grid array on top of the dielectric film and bonding wires to connect the conductive traces and the electrically conductive layer to the semiconductor die.

Another exemplary embodiment of the invention comprises a semiconductor device assembly comprising a semiconductor die attached to an electrically conductive layer with a dielectric adhesive, which may be thermally conductive. In this exemplary embodiment, the bond pads may be located around the periphery of the semiconductor die. The electrically conductive layer covers a portion of the semiconductor die such that the bond pads around the periphery are exposed. Additionally, the electrically conductive layer contains at least one current isolation slot. However, the conductive layer need not contain a longitudinal slot. A dielectric film is attached to the electrically conductive layer comprising a pattern of conductive traces extending between bonding landing areas near the periphery of the dielectric film and ball placement locations distributed across the dielectric film. Additionally, the dielectric film includes one or more conductive vias formed therethrough connecting one or more conductive traces on the top surface of the dielectric film to the electrically conductive layer adhered to the bottom surface of the dielectric film. Bonding wires connect the electrically conductive layer to one or more bond pads on the semiconductor die, which are configured for connection to the desired voltage reference. Additional bonding wires connect other bond pads on the semiconductor die to conductive traces on the electrical connection layer. Discrete conductive elements, such as solder balls, disposed on the dielectric film provide structural and electrical connection for the semiconductor die through their associated conductive traces to an external system substrate, such as a circuit board.

The invention also comprises a method of making the semiconductor device assembly. The method comprises forming electrical current isolation slots in an electrically conductive layer. The electrically conductive layer is adhered on one side to a dielectric layer bearing an electrical connection pattern as discussed above. A semiconductor die is attached to the other side of the electrically conductive layer using a thermally conductive dielectric adhesive. Wire bonding connects bond pads of the semiconductor die to the electrically conductive layer and the conductive traces of the electrical connection layer. Solder balls are formed in a grid array on the dielectric film. Finally, the assembly is encapsulated to protect the bonding wires from the elements and possible damage.

BRIEF DESCRIPTION OF THE SEVERAL VIEWS OF THE DRAWINGS

In the drawings, which illustrate what is currently considered to be the best mode for carrying out the invention.

DETAILED DESCRIPTION OF THE INVENTION

Figure 1:
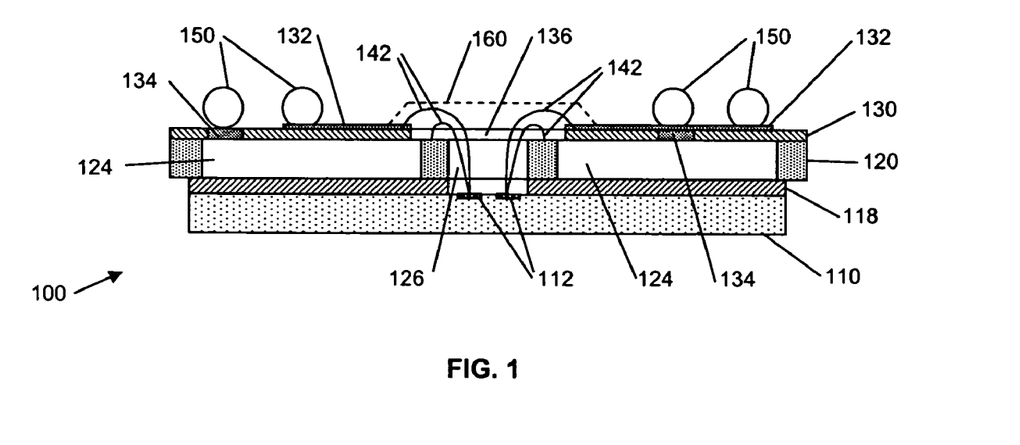
FIG. 1 is a cross-sectional view of an exemplary semiconductor device assembly of the present invention.
Figure 2:
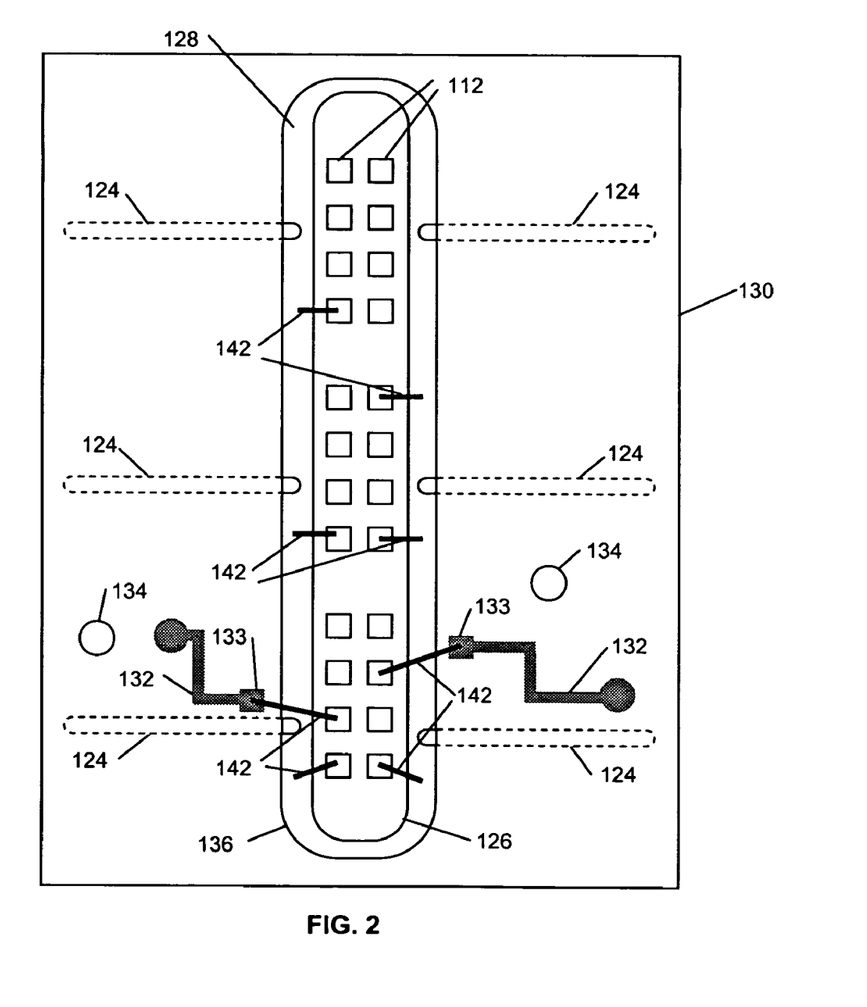
FIG. 2 is a plan view showing bond pads of a semiconductor die of the semiconductor device assembly of FIG. 1, with a superimposed electrically conductive layer and dielectric film carrying conductive traces.

One exemplary embodiment of the invention is a semiconductor device assembly 100 shown in FIG. 1. This embodiment includes a semiconductor die 110 with a plurality of bond pads 112 on the active surface thereof arranged in two parallel rows adjacent the center of the semiconductor die 110. A thermally conductive dielectric adhesive layer 118 attaches the semiconductor die 110 to an electrically conductive layer 120. The electrically conductive layer 120 includes a longitudinal slot 126 formed along the center of the electrically conductive layer 120 and traversing lengthwise such that the bond pads 112 on the semiconductor die 110 are exposed through the longitudinal slot 126. As shown in FIG. 2, the electrically conductive layer 120 also includes a plurality of electrical current isolation slots 124 therethrough. The electrically conductive layer 120 performs multiple functions. In one aspect, it is of sufficient rigidity to act as a structural support for the semiconductor die 110 and any additional assembly components against torsion and bending stresses. In another aspect, the electrically conductive layer 120 acts as a thermal conductor, or heat sink, to draw thermal energy away from the semiconductor die 110. Finally, the electrically conductive layer 120 acts as a voltage reference plane to help reduce signal noise.

High frequency signals, particularly those with fast edge rates, may induce considerable noise in power and ground planes. This noise may be introduced from many sources. Two of the most serious sources are capacitive coupling and ground bounce. Capacitive coupling may occur between two separate but adjacent conductors carrying electrical signals. A coupling effect is created through an electrical field existing in a dielectric material separating these conductors. The dielectric material may simply be air or may be any other nonconductive material separating the adjacent signal conductors. Capacitive coupling between a reference power source and a transitioning signal generally helps reduce noise and ringing on the transitioning signal. However, at the same time, it can introduce noise into the reference power source. A large plane of low impedance material connected to the reference power source reduces this noise or at least localizes the noise to a very small area near the conductor containing the transitioning signal.

Ground bounce is created by fast edge rates on transitioning signals from output pads on the semiconductor die 110 sometimes used to drive heavy capacitive loads. When a typical output signal transitions, the semiconductor device assembly 100 must source, or sink, a large amount of current to charge the capacitive load and cause the transition. Any impedance on the reference power source supplying this current will cause a localized "bounce" or voltage movement away from the desired reference. Ground bounce is minimized by ensuring a low impedance path on the ground signal, typically with large ground planes, to the switching device.

This "bounce" phenomenon may also exist for a reference power source as well as in the instance of a ground source. Reference power sources are often used in modern semiconductor devices for, among other things, defining a voltage reference for sensing input signal levels. Providing this reference power source using the electrically conductive layer 120 as part of the semiconductor device assembly creates a low impedance, low noise reference plane near the input level sensor relying on the reference power source.

Additionally, electrical current isolation slots 124 may be used to provide isolation between reference power source segments that must supply a large amount of switching current and other segments of the reference power source. This isolation may assist in creating a "quieter" reference environment for signals that are more vulnerable to noise on the reference power source. This isolation is achieved by creating narrow areas 125 in the electrically conductive layer 120. The narrow areas 125, in FIG. 3B for example, between the electrical current isolation slots 124 and the longitudinal slot 126 create a higher resistance, therefore presenting a relatively high impedance to high frequency signals. At the same time, the narrow areas 125 are not such a high resistance that they present a high impedance to low frequency signals. This design providing low impedance to low frequency signals may be important to prevent ground loops from forming. An optimum width of narrow areas 125 may be readily ascertained for a given application by one of ordinary skill in the art.

The electrically conductive layer 120 may connect to different types of reference voltage sources, the most typical being a ground voltage reference. In most applications, ground integrity and maintaining a ground reference free from noise and bounce is of primary significance. However, there are other applications where it may be desirable to connect a power voltage reference, such as VCC, to the electrically conductive layer 120 to help reduce noise on the power signal. Additionally, some modern switching signals use intermediate voltage references to aid in switching or, in low voltage signal switching environments, detecting the transition point at which a switch occurs. In these environments, it may be desirable to create a low noise environment for this intermediate voltage reference by connecting it to the electrically conductive layer 120. To make the connection to the desired voltage source, bonding wires (also referred to as electrical connectors) 142 connect between an electrical conductor landing area 128 on the electrically conductive layer 120 and bond pads 112 on the semiconductor die 110 that are connected to the desired voltage source.

The number of electrical current isolation slots 124 and their respective locations in the electrically conductive layer 120 may vary greatly with the type of semiconductor die 110, the locations of bond pads 112 connected to the desired voltage source, and locations of other bond pads 112. Note that bond pads 112 other than those connected to the electrically conductive layer 120 may be referred to as "signal bond pads." However, this latter group of bond pads 112 encompasses all bond pads 112 that are not connected to the electrically conductive layer 120 and may include voltage references, power signals, and ground signals.

As an example of a current isolation slot 124 configuration, it may be desirable to partition the electrically conductive layer 120 into different segments based on input/output type. Creating a segment supporting all inputs different from the segment supporting all outputs helps to isolate the input signals from the noise problems caused by switching outputs. As another example, it may be desirable to create a segment that isolates a specific area of the ground plane relative to how the ground plane is configured on the semiconductor die 110.

Figure 3A:
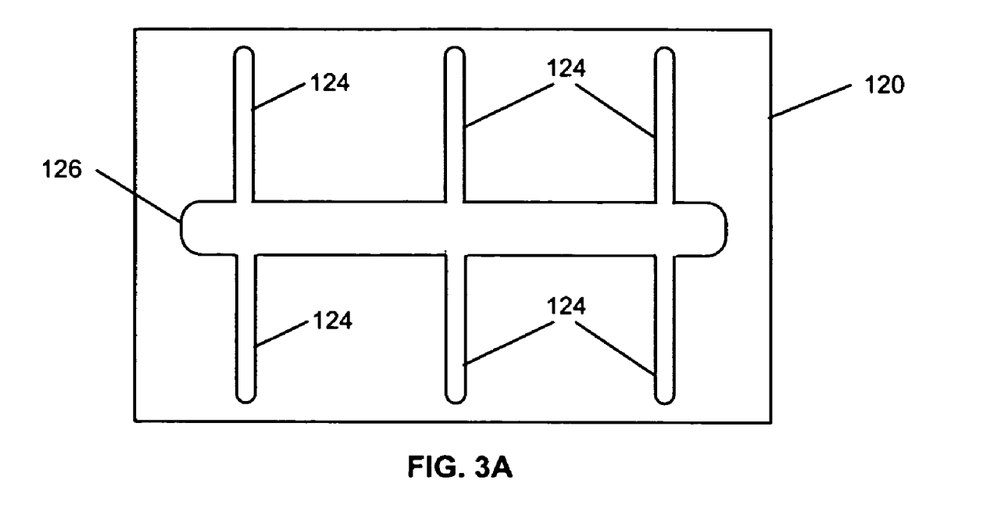
FIGS. 3A and 3B are plan views of other exemplary embodiments of an electrically conductive layer including electrical current isolation slots.
Figure 3B:
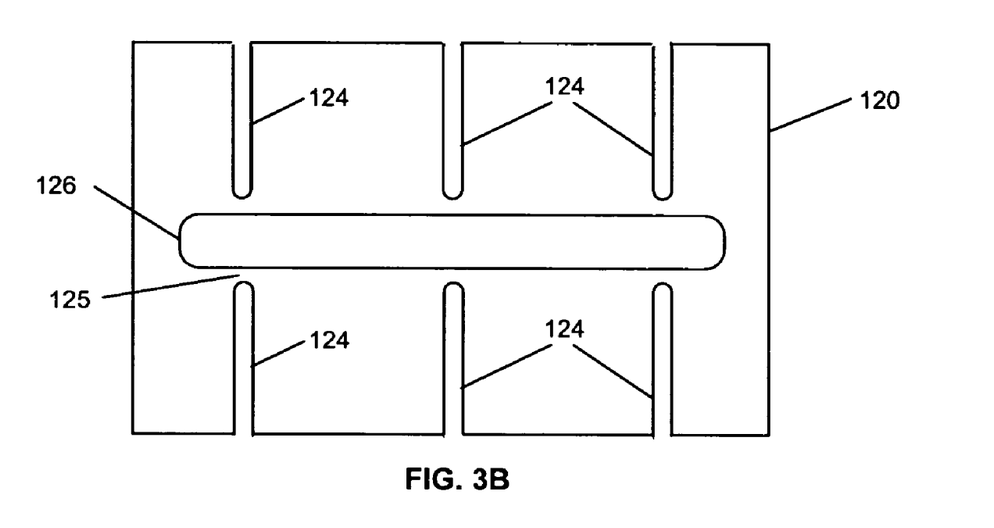

FIG. 2 depicts current isolation slots 124 extending from proximate the longitudinal slot 126 to proximate the laterally peripheral edges of the electrically conductive layer 120. FIGS. 3A and 3B show other examples of how the current isolation slots 124 may be located and configured on the electrically conductive layer 120. In FIG. 3A, the current isolation slots 124 extend from, and are contiguous with, the longitudinal slot 126 to proximate the laterally peripheral edges of the electrically conductive layer 120. In FIG. 3B, the current isolation slots 124 extend from, and intersect, the laterally peripheral edges of the electrically conductive layer 120 to proximate the longitudinal slot 126.

Figure 5:
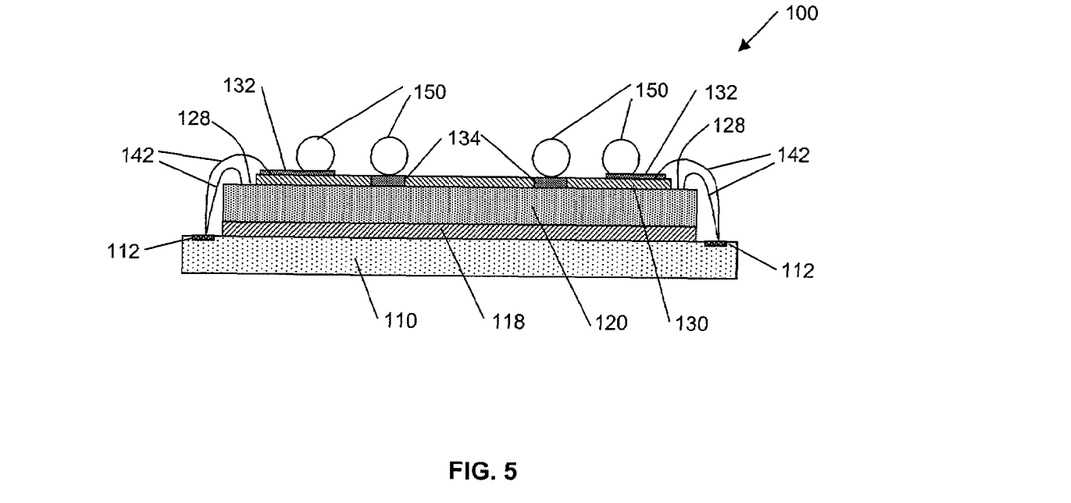
FIG. 5 is a cross-sectional view of another exemplary embodiment of the semiconductor device assembly of the present invention with bond pads around the periphery of a semiconductor die.
Figure 6A:
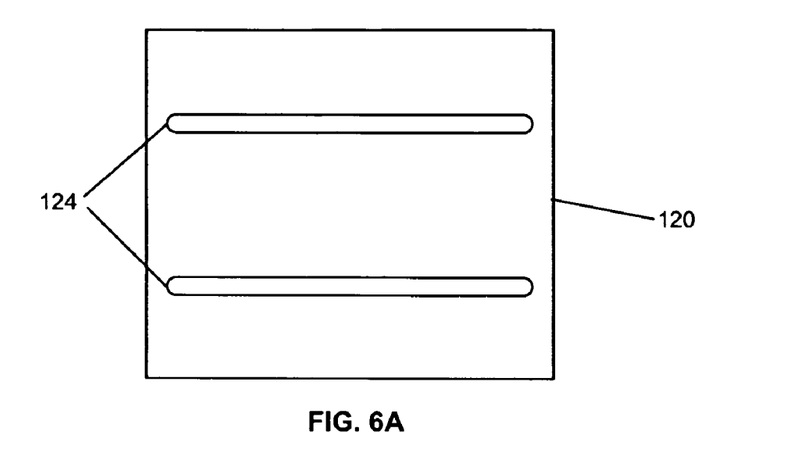
FIGS. 6A, 6B, and 6C are exemplary embodiments of an electrically conductive layer suitable for use with the semiconductor device assembly of FIG. 5.
Figure 6B:
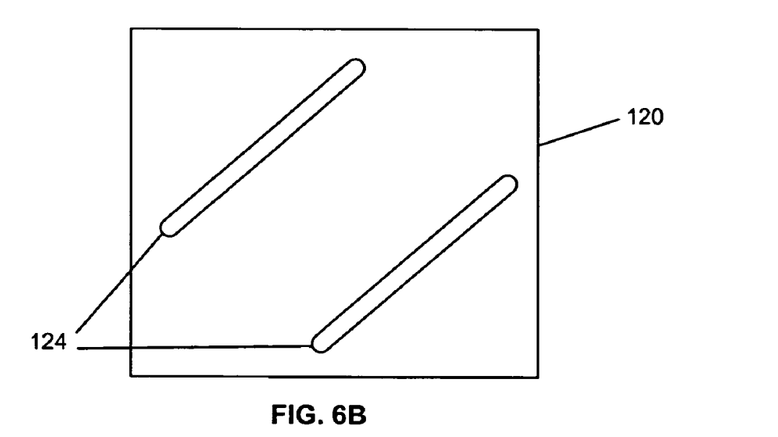
Figure 6C:
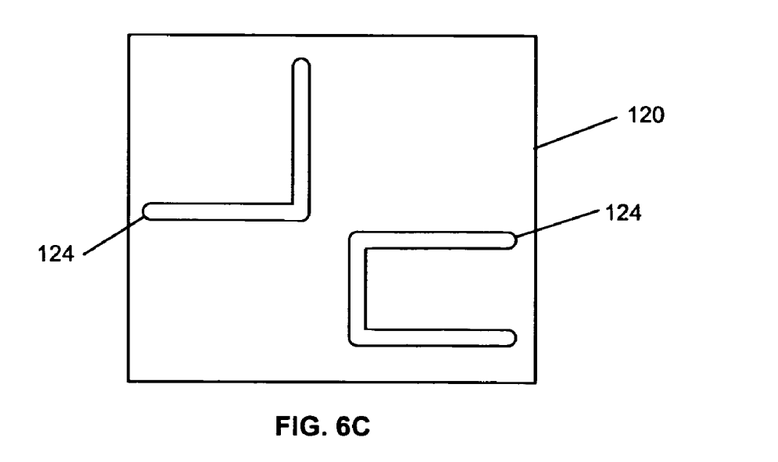

FIG. 5 depicts another exemplary embodiment of the semiconductor device assembly 100 comprising a semiconductor die 110 with the bond pads 112 disposed around the periphery of the semiconductor die 110 rather than along the center of the semiconductor die 110. In this embodiment, the electrically conductive layer 120 covers only the portion of the die between the bond pads 112 on the periphery of the semiconductor die 110 such that the bond pads 112 are exposed. As shown in FIG. 6A, electrical current isolation slots 124 suitable for use in this embodiment may extend from proximate one peripheral edge to proximate the laterally opposite peripheral edge of electrically conductive layer 120. Additionally, electrical current isolation slots 124 may be nonlinear. Electrical current isolation slots 124 may, for example, form an L shape or a U shape, as shown in FIG. 6C. As another example, electrical current isolation slots 124 may form diagonal lines relative to the peripheral edges of the electrically conductive layer 120, as shown in FIG. 6B.

Clearly, the electrical current isolation slots 124 shown and described are exemplary and a large variety of placement, shape, and number thereon is contemplated as within the scope of this invention. Additionally, the electrically conductive layer 120 is comprised of a thermally and electrically conductive material. This would typically be a metal, such as copper. However, other metals, alloys, and other suitable materials such as ceramics, which are thermally and electrically conductive, are within the scope of this invention.

FIGS. 1, 2, and 5 also show a dielectric film 130, which may comprise a polyimide film such as KAPTON® polymer. As can be seen in FIGS. 1 and 5, the dielectric film 130 is attached to the surface of the electrically conductive layer 120 on the side opposite the semiconductor die 110. The dielectric film 130 provides an electrically insulative layer on the electrically conductive layer 120. In FIG. 2, the dielectric film 130 includes a longitudinal slot 136 therethrough similar in placement to the longitudinal slot 126 in the electrically conductive layer 120. However, the longitudinal slot 136 is wider than the longitudinal slot 126 such that an electrical conductor landing area 128 is exposed on the electrically conductive layer 120. This electrical conductor landing area 128 provides a place for bonding wires to bond to the electrically conductive layer 120 on one side and bond pads 112 on the semiconductor die 110 on the other side. For a semiconductor die 110 with bond pads 112 around the periphery of the semiconductor die, as shown in FIG. 5, the dielectric film 130 may be somewhat smaller than the electrically conductive layer 120 such that an electrical conductor landing area 128 is exposed around the periphery of the electrically conductive layer 120 where bonding to the electrically conductive layer is desired.

Additionally, the dielectric film 130 bears conductive traces 132 of an interconnect pattern provided by an electrical connection layer. The conductive traces 132 provide connections extending between discrete conductive elements 150 of the BGA and landings 133 provided for receiving bonding wires 142 extending from bond pads 112 on the semiconductor die 110. Conductive traces 132 may be formed by masking and etching a metal sheet (such as copper) laminated to dielectric film 130, stenciled or screen printed thereon, or preformed and applied thereto. Conductive vias 134 extending through the dielectric film 130 conduct electricity and heat from the electrically conductive layer 120 through the dielectric film 130, through selected discrete conductive elements 150, which are isolated from conductive traces 132, and to a system substrate (not shown).

Figure 4:
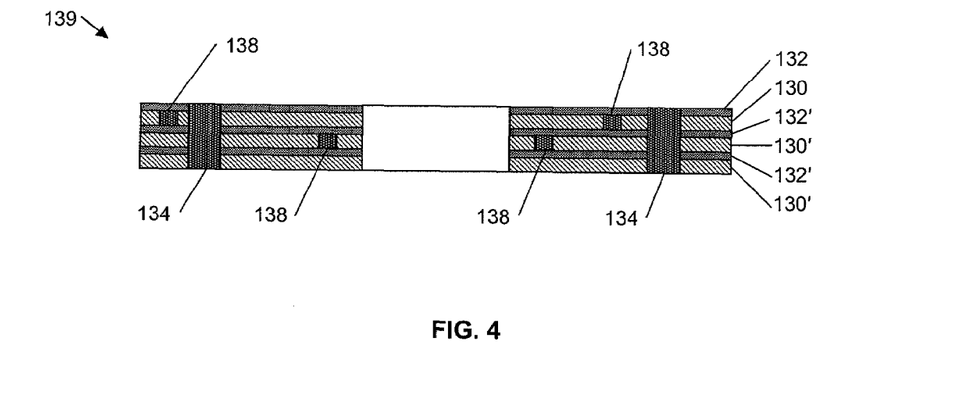
FIG. 4 is a cross-sectional view of a multi-layer substrate including a plurality of conductive layers according to the present invention.

As shown in FIG. 4, the dielectric film 130 may also be fabricated as a multilayer dielectric film 139 comprised of additional electrical connection layers, each including conductive traces 132' and additional dielectric layers 130' disposed therebetween. Multiple layers of conductive traces 132' may aid in signal routing for complex designs. In some complex designs, placement of discrete conductive elements 150, such as solder balls, may not match with bond pads 112 on the semiconductor die 110 in such a way as to facilitate direct routing on a single layer from the bond wire landings 133 to the locations of discrete conductive elements 150. Interlayer conductive vias 138 enable connection between conductive traces 132' of different additional electrical connection layers as well as connection to conductive traces 132 on the top electrical connection layer. The conductive vias 134 for connecting between the electrically conductive layer 120 and the conductive traces 132 are formed through all dielectric layers (i.e., film 130 and layer 130') and in isolation from conductive traces (132 and 132'). By way of example, FIG. 4 shows conductive traces 132' for two additional electrical connection layers and two additional interposed dielectric layers 130'. However, many numbers and configurations of the conductive traces 132 and dielectric film 130 are possible within the scope of the present invention.

The discrete conductive elements 150 such as solder balls, may be formed or disposed on the conductive traces 132 of an electrical connection layer. These discrete conductive elements 150 create the means for physically attaching and electrically coupling the semiconductor device assembly 100 to an external system substrate (not shown). These discrete conductive elements 150 are typically formed of solder but may be in the form of other package connection means, such as stud bumps, plated bumps, conductive polymers, or conductor-filled polymers.

A dielectric encapsulant 160 well known in the art, such as an epoxy resin, may be used to provide protection from damage and the elements by covering the bond pads 112 of the semiconductor die 110 exposed through the longitudinal slot 126 and bonding wires 142, as shown in broken lines in FIG. 1. Dielectric encapsulant 160 may, for example, comprise a silicone-filled thermoplastic resin applied by transfer molding or injection molding. Dielectric encapsulant 160 may also be applied using stereolithographic techniques, with a photocurable polymer.

Another exemplary embodiment of the invention comprises a semiconductor package substrate prior to attachment to a semiconductor die 110 or discrete conductive elements 150. This embodiment comprises the electrically conductive layer 120 attached to the dielectric film 130 as described above.

A method of producing the semiconductor device assembly 100 is described. The electrical current isolation slots 124 and longitudinal slot 126 (if present) may be formed in the electrically conductive layer 120 by means well known in the art, such as by stamping, chemical etching, electro-discharge machining (EDM), or laser ablation. As noted above, a desirable number, location, and configuration of the electrical current isolation slots 124 may be determined based on the architecture and characteristics of the semiconductor die 110 to be attached or the system substrate to which the semiconductor device assembly 100 will be attached.

The dielectric film 130 is adhered to one side of the electrically conductive layer 120. Adhesion may be accomplished with many techniques well known in the art, such as by using a thermoset or thermoplastic adhesive. As part of the fabrication process, conductive vias 134 may be formed through the dielectric film 130 and filled with a conductive material to connect to the electrically conductive layer 120 such that the conductive vias 134 can conduct heat and electrical current to and from the electrically conductive layer 120. Conductive vias 134 may be filled using stencils, screen-printing, electroplating, or electroless plating, as known in the art.

Discrete conductive elements 150 are formed, or disposed, in array fashion, on the top of the dielectric film 130 such that they connect to the conductive vias 134 and conductive traces 132 of the electrical connection layer formed on the dielectric film 130 after dielectric encapsulant 160 is applied. A semiconductor die 110 is attached to the bottom surface of the electrically conductive layer 120 using a thermally conductive dielectric adhesive layer 118 well known in the art, such as thermoset adhesives, thermoplastic adhesives, and adhesive tape. Bond pads 112 are electrically connected to the conductive traces 132 of the electrical connection layer on the dielectric film 130 using a conventional wire bonding technique. Similarly, bond pads 112 connected to the desired voltage source are electrically connected to the electrically conductive layer 120 using a conventional wire bonding technique. After wire bonding, the bond pads 112 of the semiconductor die 110 exposed through the longitudinal slot 126 and bonding wires 142 may be covered with a dielectric encapsulant 160, as known in the art, for protection from physical damage and the environment.

Finally, if the semiconductor device assembly 100 is fabricated as part of tape or strip of package substrates, the individual assemblies are singulated from each other. The singulation process may be performed in many well known means capable of forming a cut through the dielectric film 130 and electrically conductive layer 120 such as, for example, sawing, punching using a punch press, or laser ablation.

Although this invention has been described with reference to particular embodiments, the invention is not limited to these described embodiments. Rather, the invention is limited only by the appended claims, which include within their scope all equivalent devices or methods that operate according to the principles of the invention as described.

What is claimed is:

1. A method of making a semiconductor device assembly, the method comprising:
    forming at least one electrical current isolation slot in an electrically conductive layer; and
    adhering the electrically conductive layer to a dielectric film bearing at least one conductive trace and at least one conductive via therethrough such that the at least one conductive via operably couples to the electrically conductive layer and at least a portion of the at least one electrical current isolation slot is coextensive with the dielectric film.

2. The method of claim 1, further comprising:
locating a plurality of discrete conductive elements on a surface of the dielectric film such that at least one of the plurality of discrete conductive elements operably couples to the at least one conductive trace and at least one other of the plurality of discrete conductive elements operably couples to the at least one conductive via.

3. The method of claim 1, further comprising:
attaching a semiconductor die having a plurality of bond pads on an active surface thereof to a surface of the electrically conductive layer with a thermally conductive dielectric adhesive layer.

4. The method of claim 3, further comprising:
providing a plurality of electrical conductors to the semiconductor die to operably couple at least one of the plurality of electrical conductors between at least one of the plurality of bond pads and the electrically conductive layer and at least one other electrical conductor between at least one other bond pad and the at least one conductive trace.

5. The method of claim 4, further comprising:
forming a longitudinal slot through the dielectric film.

6. The method of claim 4, further comprising dielectrically encapsulating the plurality of electrical conductors and the plurality of bond pads.

7. The method of claim 1, further comprising:
singulating the semiconductor device assembly from a strip comprising a plurality of semiconductor device assemblies.

8. The method of claim 7, wherein singulating the semiconductor device assembly is selected from the group consisting of sawing, punching, and laser ablation.

9. The method of claim 1, wherein adhering the electrically conductive layer is achieved using a thermally conductive dielectric adhesive.

10. The method of claim 5, further comprising forming a longitudinal slot through the electrically conductive layer; and operably coupling the plurality of electrical conductors through the longitudinal slot through the electrically conductive layer and the longitudinal slot through the dielectric film.

11. The method of claim 10, wherein forming the longitudinal slot through the dielectric film comprises forming the longitudinal slot to be wider than the longitudinal slot through the electrically conductive layer.

12. The method of claim 11, wherein forming the longitudinal slot to be wider than the longitudinal slot though the electrically conductive layer comprises exposing an electrical conductor landing area on the electrically conductive layer.

13. The method of claim 10, wherein forming the longitudinal slot though the dielectric film comprises forming the longitudinal slot along the center of the electrically conductive layer.

14. The method of claim 2, wherein locating a plurality of discrete conductive elements on a surface of the dielectric film comprises forming or disposing conductive traces on the surface of the dielectric film.

15. The method of claim 1, wherein forming at least one electrical current isolation slot in the electrically conductive layer comprises forming at least one non-linear electrical current isolation slot.

16. The method of claim 1, wherein forming at least one electrical current isolation slot is effected by at least one of stamping, chemical etching, electro-discharge machining, and laser ablation.

17. A method of making a semiconductor device assembly, the method comprising:
disposing an electrically conductive layer between an active surface of a semiconductor die and a dielectric film, the dielectric film having at least one conductive trace disposed upon a surface thereof and at least one conductive via formed therethrough; and
forming at least one electrical current isolation slot in the electrically conductive layer, wherein at least a portion of the at least one electrical current isolation slot extends between the dielectric film and the active surface of the semiconductor.

18. The method of claim 17, further comprising operably coupling at least one bond pad on the active surface of the semiconductor die with the electrically conductive layer with at least one electrical conductor and operably coupling at least one other bond pad on the active surface of the semiconductor die with the at least one conductive trace with at least one other electrical conductor.

19. The method of claim 18, further comprising locating a plurality of discrete conductive elements on a surface of the dielectric film such that at least one of the plurality of discrete conductive elements operably couples to the at least one conductive trace and at least one other of the plurality of discrete conductive elements operably couples to the at least one conductive via.

20. The method of claim 19, further comprising forming the plurality of discrete conductive elements with a material selected from the group consisting of solder, stud bumps, plated bumps, conductive polymers, and conductor-filled polymers.

* * * * *

UNITED STATES PATENT AND TRADEMARK OFFICE
CERTIFICATE OF CORRECTION

PATENT NO. : 7,501,313 B2  Page 1 of 1
APPLICATION NO. : 11/483452
DATED : March 10, 2009
INVENTOR(S) : Morrison et al.

It is certified that error appears in the above-identified patent and that said Letters Patent is hereby corrected as shown below:

In column 9, line 47, in Claim 12, delete "though" and insert -- through --, therefor.

In column 10, line 2, in Claim 13, delete "though" and insert -- through --, therefor.

Signed and Sealed this

Twenty-third Day of June, 2009

JOHN DOLL
*Acting Director of the United States Patent and Trademark Office*